United States Patent
Yang et al.

(10) Patent No.: US 7,679,395 B1
(45) Date of Patent: Mar. 16, 2010

(54) LOW-LOSS IMPEDANCE-MATCHED SOURCE-FOLLOWER FOR REPEATING OR SWITCHING SIGNALS ON A HIGH SPEED LINK

(75) Inventors: Yunfu Yang, Shanghai (CN); Shengyuan Zhang, Shanghai (CN); Yu Min Zhang, Shanghai (CN); Shoujun Wang, Ottowa (CA)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 12/210,316

(22) Filed: Sep. 15, 2008

(51) Int. Cl.
*H03K 17/16* (2006.01)
(52) U.S. Cl. .............................. 326/27; 326/83; 326/30
(58) Field of Classification Search .................. 326/26, 326/27, 30, 82–87
See application file for complete search history.

(56) References Cited

U.S. PATENT DOCUMENTS

| | | | |
|---|---|---|---|
| 6,404,230 B1 * | 6/2002 | Cairns et al. .................. | 326/68 |
| 7,221,192 B1 * | 5/2007 | Talbot .......................... | 327/99 |
| 2003/0197552 A1 * | 10/2003 | Watanabe ..................... | 327/541 |
| 2006/0164152 A1 * | 7/2006 | Tschanz et al. ............. | 327/530 |
| 2008/0309397 A1 * | 12/2008 | Kerns .......................... | 327/534 |

* cited by examiner

*Primary Examiner*—Don P Le
(74) *Attorney, Agent, or Firm*—Tracy Parris (57) ABSTRACT

Switching and repeating applications using an impedance matched source follower improve performance of high speed links such as PCI Express, HDMI, DisplayPort and DVI by reducing attenuation and other degradation of high speed signals, including those with transmit pre-emphasis, by avoiding impedance discontinuities over process, voltage and temperature variations and by driving a broader range of loads, e.g., heavily capacitive loads. A circuit for switching or repeating signals on a single-ended or differential high speed link may comprise a source follower with input and output impedances matched to input and output transmission lines on the high speed link. The source follower is biased by a constant transconductance circuit, an external calibration circuit or other circuit to provide an essentially constant output impedance over process, voltage and temperature variations.

20 Claims, 3 Drawing Sheets

LOW-LOSS IMPEDANCE-MATCHED SOURCE-FOLLOWER FOR REPEATING OR SWITCHING SIGNALS ON A HIGH SPEED LINK

CROSS REFERENCE TO RELATED APPLICATIONS

This application is related to U.S. patent application Ser. No. 12/210,343 filed Sep. 15, 2008, entitled "REDUCED POWER DIFFERENTIAL TYPE TERMINATION CIRCUIT," which is the entire contents of which are hereby incorporated by reference as if fully set forth herein.

TECHNICAL FIELD

The present invention generally relates to integrated circuits in the field of high speed data transmission. More particularly, the invention relates to integrated circuits for repeating or switching signals in high speed data transmission links.

BACKGROUND

Figure 1:
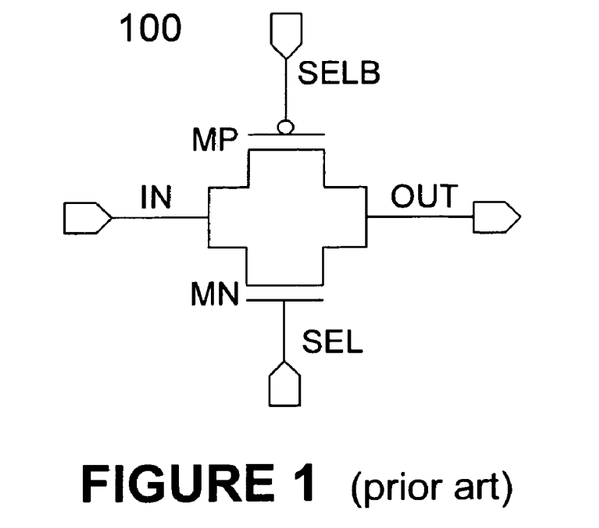
FIG. 1 illustrates a well known circuit (i.e. CMOS transmission gate) used in repeater/switch applications.

FIG. 1 illustrates a well known circuit (i.e. CMOS transmission gate) used in repeater/switch applications. Transmission gate 100 comprises the parallel coupling of NMOS transistor MN and PMOS transistor MP. The gates of transistors MN, MP are controlled by differential or complementary signals SEL and SELB. While in theory transmission gate 100 is designed to pass a full range of signals from input IN to output OUT, in practice the sizing of transistors MN and MP involves a tradeoff between $R_{on}$ and $C_{on}$ parameters responsible for creating an RC time constant. The often large time constant results in transmission gate 100 acting as a low pass filter that degrades or attenuates high speed signals. Additionally, the parasitic $R_{on}$ parameter leads to an impedance discontinuity in the transmission line (e.g. 50 Ohms), resulting in unwanted reflections that further undermine signal integrity. There is a need to improve the performance of signal switching/repeating circuitry for high speed links.

SUMMARY

This Summary is provided to introduce concepts in a simplified form. These concepts are described in greater detail below in the section entitled Detailed Description Of Illustrative Embodiments. This Summary is not intended to identify key or essential features of the claimed subject matter, nor limit the scope thereof.

The present invention provides for switching or repeating signals on a high speed link with improved performance using an impedance-matched source follower. High speed links include, for example, Peripheral Component Interconnect (PCI) Express, High Definition Multimedia Interface (HDMI), DisplayPort and Digital Visual Interface (DVI). The specifications for these high speed links are well known. A circuit for switching or repeating signals on a high speed link in accordance with some embodiments of the invention may comprise, for example, an input and an output for coupling, respectively, to input and output transmission lines for the high speed link; a termination resistor coupling the input to a termination voltage (e.g. for impedance matching and application of a bias voltage); a first transistor, having first gate, source and drain terminals, configured as a source follower wherein the first gate terminal is coupled to the input, the first source terminal is coupled to the output and the first drain terminal is coupled to a voltage source; and a bias current circuit coupled to the first source terminal and output for providing bias current for the first transistor resulting in essentially constant output impedance over process, voltage and temperature variations.

A circuit for switching or repeating signals on a differential signal high speed link in accordance with some embodiments of the invention may comprise, for example, a differential input comprising positive input and negative input for coupling to differential input transmission lines for the high speed link; a differential output comprising positive output and negative output for coupling to differential output transmission lines for the high speed link; a first termination resistor coupling the positive input to a termination voltage; a second termination resistor coupling the negative input to the termination voltage; a first transistor, having first gate, source and drain terminals, configured as a source follower wherein the first gate terminal is coupled to the positive input, the first source terminal is coupled to the positive output and the first drain terminal is coupled to a voltage source; a second transistor, having second gate, source and drain terminals, configured as a source follower wherein the second gate terminal is coupled to the negative input, the second source terminal is coupled to the negative output and the second drain terminal is coupled to the voltage source; and a bias current circuit coupled to the first and second source terminals and the positive and negative outputs for providing bias currents for the first and second transistors resulting in essentially constant output impedance over process, voltage and temperature variations.

A system for switching or repeating signals on a high speed link in accordance with some embodiments of the invention may comprise, for example, a high speed link comprising input and output transmission lines; a transmitter coupled to the input transmission line; a receiver coupled to the output transmission line; and a circuit coupled between the input and output transmission lines for switching or repeating signals transmitted onto the input transmission line by the transmitter, the circuit comprising: an input and an output for coupling, respectively, to the input and output transmission lines; a termination resistor coupling the input to a termination voltage; a first transistor, having first gate, source and drain terminals, configured as a source follower wherein the first gate terminal is coupled to the input, the first source terminal is coupled to the output and the first drain terminal is coupled to a voltage source; and a bias current circuit coupled to the first source terminal and output for providing bias current for the first transistor resulting in essentially constant output impedance over process, voltage and temperature variations.

In some embodiments the bias current circuit may comprise, for example, a constant transconductance bias circuit; and a second transistor, having second gate, source and drain terminals, wherein the second drain terminal is coupled to the first source terminal and the output, the second source terminal is coupled to ground and the second gate terminal is coupled to the constant transconductance bias circuit. In other embodiments the bias current circuit may comprise an external calibration circuit.

While in some implementations it may consume more power than some well known repeaters and switches, switching or repeating signals on a high speed link using an impedance matched source follower, at least in some implementations, may improve signal integrity through reduced attenuation and other degradation of high speed signals and by avoiding impedance discontinuities over process, voltage and temperature variations. It may also improve repeater/switch performance and utility by passing signals with higher frequencies, including those with transmit pre-emphasis, and by driving a broader range of loads, e.g., heavily capacitive loads. It may also be implemented at less cost and die area relative to other competing solutions.

BRIEF DESCRIPTION OF THE DRAWINGS

The foregoing summary, as well as the following detailed description, is better understood when read in conjunction with the accompanying drawings. For the purpose of illustrating various aspects of low-loss, impedance matched signal switching/repeating in high speed links, there is shown in the drawings exemplary implementations thereof. However, low-loss, impedance matched signal switching/repeating in high speed links is not limited to the specific implementations disclosed herein.

DETAILED DESCRIPTION OF ILLUSTRATIVE EMBODIMENTS

Reference will now be made to embodiments of the present technology for low-loss, impedance-matched source follower for repeating or switching signals on a high speed link, examples of which are illustrated in the accompanying drawings. While the technology for low-loss, impedance-matched source follower for repeating or switching signals on a high speed link will be described in conjunction with various embodiments, it will be understood that the embodiments are not intended to limit the present technology. On the contrary, the present technology is intended to cover alternatives, modifications, and equivalents, which may be included within the spirit and scope the various embodiments as defined by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

Unless specifically stated otherwise, terms such as "sampling," "latching," "determining," "selecting" "storing," "registering," "creating," "including," "comparing," "receiving," "providing," "generating," "associating," and "arranging", or the like, refer to the actions and processes of an electronic device that manipulates and transforms data represented as physical (electronic) quantities within the electronic device.

Certain terms are used throughout the following description and claims to refer to particular system components and configurations. As one skilled in the art will appreciate, various skilled artisans and companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection or though an indirect electrical connection via other devices and connections. Furthermore, the term "information" is intended to refer to any data, instructions, or control sequences that may be communicated between components of a device. For example, if information is sent between two components, data, instructions, control sequences, or any combination thereof may be sent between the two components.

The present invention provides for switching or repeating signals on a high speed link with improved performance using an impedance-matched source follower. High speed links include, but are not limited to, Peripheral Component Interconnect (PCI) Express, High Definition Multimedia Interface (HDMI), DisplayPort and Digital Visual Interface (DVI). A circuit for switching or repeating signals on a high speed link in accordance with some embodiments of the invention may comprise, for example, an input and an output for coupling, respectively, to input and output transmission lines for the high speed link; a termination resistor coupling the input to a termination voltage (e.g. for impedance matching and application of a bias voltage); a first transistor, having first gate, source and drain terminals, configured as a source follower wherein the first gate terminal is coupled to the input, the first source terminal is coupled to the output and the first drain terminal is coupled to a voltage source; and a bias current circuit coupled to the first source terminal and output for providing bias current for the first transistor resulting in essentially (i.e. +/−5%) constant output impedance over process, voltage and temperature variations.

A circuit for switching or repeating signals on a differential signal high speed link in accordance with some embodiments of the invention may comprise, for example, a differential input comprising positive input and negative input for coupling to differential input transmission lines for the high speed link; a differential output comprising positive output and negative output for coupling to differential output transmission lines for the high speed link; a first termination resistor coupling the positive input to a termination voltage; a second termination resistor coupling the negative input to the termination voltage; a first transistor, having first gate, source and drain terminals, configured as a source follower wherein the first gate terminal is coupled to the positive input, the first source terminal is coupled to the positive output and the first drain terminal is coupled to a voltage source; a second transistor, having second gate, source and drain terminals, configured as a source follower wherein the second gate terminal is coupled to the negative input, the second source terminal is coupled to the negative output and the second drain terminal is coupled to the voltage source; and a bias current circuit coupled to the first and second source terminals and the positive and negative outputs for providing bias currents for the first and second transistors resulting in essentially constant output impedance over process, voltage and temperature variations.

A system for switching or repeating signals on a high speed link in accordance with some embodiments of the invention may comprise, for example, a high speed link comprising input and output transmission lines; a transmitter coupled to the input transmission line; a receiver coupled to the output transmission line; and a circuit coupled between the input and output transmission lines for switching or repeating signals transmitted onto the input transmission line by the transmitter, the circuit comprising: an input and an output for coupling, respectively, to the input and output transmission lines; a termination resistor coupling the input to a termination voltage; a first transistor, having first gate, source and drain terminals, configured as a source follower wherein the first gate terminal is coupled to the input, the first source terminal is coupled to the output and the first drain terminal is coupled to a voltage source; and a bias current circuit coupled to the first source terminal and output for providing bias current for the first transistor resulting in essentially constant output impedance over process, voltage and temperature variations.

Figure 2:
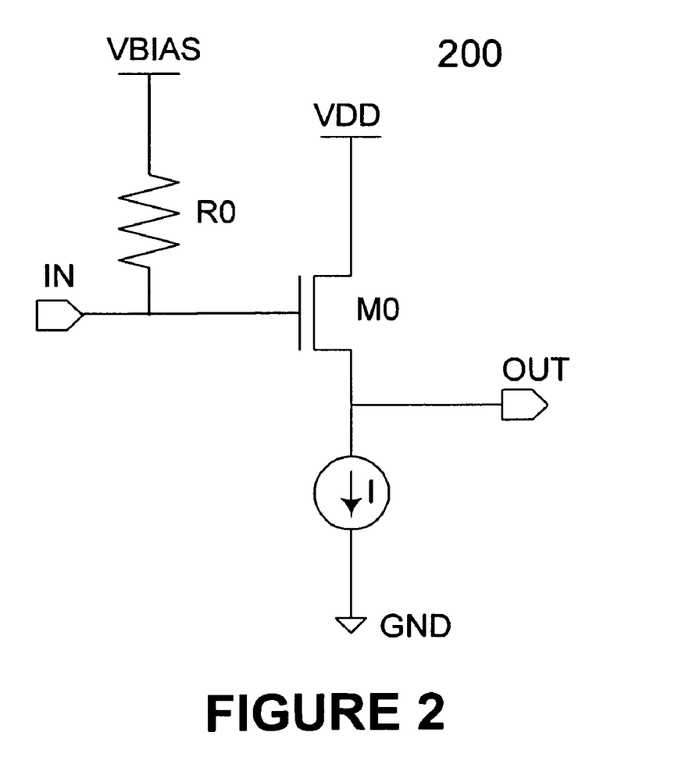
FIG. 2, in accordance with some embodiments of the invention, illustrates an exemplary implementation of a low-loss, impedance-matched source follower for repeating or switching signals on a high speed link.

FIG. 2, in accordance with some embodiments of the invention, illustrates an exemplary implementation of a low-loss, impedance-matched source follower for repeating or switching signals on a high speed link. As illustrated in FIG. 2, exemplary circuit 200 comprises signal input port IN, signal output port OUT, source voltage VDD, termination or bias voltage VBIAS, signal ground GND, source follower transistor M0, termination resistor R0, and bias current I. Signal input port IN and signal output port OUT are for coupling, respectively, to input and output transmission lines of the high speed link.

Signal input port IN is terminated to bias voltage VBIAS through termination resistor R0. The value of termination resistor R0 may be selected to approximately (i.e. within a tolerance of +/−10%) match the impedance of a high speed link transmission line coupled to input port IN. For example, when the impedance of the transmission line is 50 Ohms, termination resistor R0 may also be 50 Ohms. The magnitude of bias voltage VBIAS may be, for example, one-half or two-thirds the magnitude of source voltage VDD, which provides power for circuit operation. The magnitude of source voltage VDD as well as component parameters may vary depending on the technology, e.g., 3.3 V, 1.8 V. Any appropriate termination technique may be used in addition to or in place of biased termination resistor R0, including the improved differential type termination technique presented in U.S. patent application Ser. No. 12/210,343 filed Sep. 15, 2008, entitled "REDUCED POWER DIFFERENTIAL TYPE TERMINATION CIRCUIT," which may reduce the direct current necessary to produce bias voltage VBIAS while maintaining or improving signal integrity and overall performance.

Source follower transistor M0 is an NMOS transistor configured as a source follower. However, in other embodiments, source follower transistor M0 may be a transistor of a different type or technology. For example, an alternative embodiment may use a PMOS transistor as a source follower. As illustrated in FIG. 2, source follower transistor M0 has gate, source and drain terminals. While it isn't shown, source follower transistor M0 may also have a bulk terminal. The gate terminal of source follower transistor M0 is coupled (as shown, directly coupled) to input port IN so that an input signal controls source follower transistor M0. The source terminal of source follower transistor M0 is coupled (as shown, directly coupled) to output port OUT and a bias current source providing bias current I. The drain terminal of source follower transistor M0 is coupled (as shown, directly coupled) to source voltage VDD.

In some embodiments, in order to avoid a body effect (i.e. threshold variation), the bulk and source terminals of source follower transistor M0 may be connected, e.g., by constructing source follower transistor M0 using a deep n-well process to connect the bulk to the source. In some embodiments, the gain of source follower transistor M0 may be set at or close to unity so that the amplitude of the signal it outputs through output port OUT closely follows the amplitude of the signal is receives through input port IN. In other embodiments, the gain may be fixed or variable in accordance with the needs of a particular implementation.

The output impedance of source follower transistor M0, which is the inverse of its transconductance $g_m$, depends on the sizing (i.e. ratio of channel width and length) of source follower transistor M0 and bias current I. Bias current source I is coupled to the source terminal of source follower transistor M0 and output port OUT for purposes of providing bias current for source follower transistor M0 having predetermined parameters. As a result of bias current source I, the output impedance of source follower transistor M0 is essentially constant over process, voltage and temperature variations. The output impedance, through component and parameter selection, is designed to match the impedance of an output transmission line in the high speed link irrespective of process, voltage and temperature variations. The components in circuit 200 and their parameters may vary from one embodiment to the next. As is common with circuit design, components and parameters may be selected and optimized through simulation and testing to select components and values for particular implementations.

Figure 3:
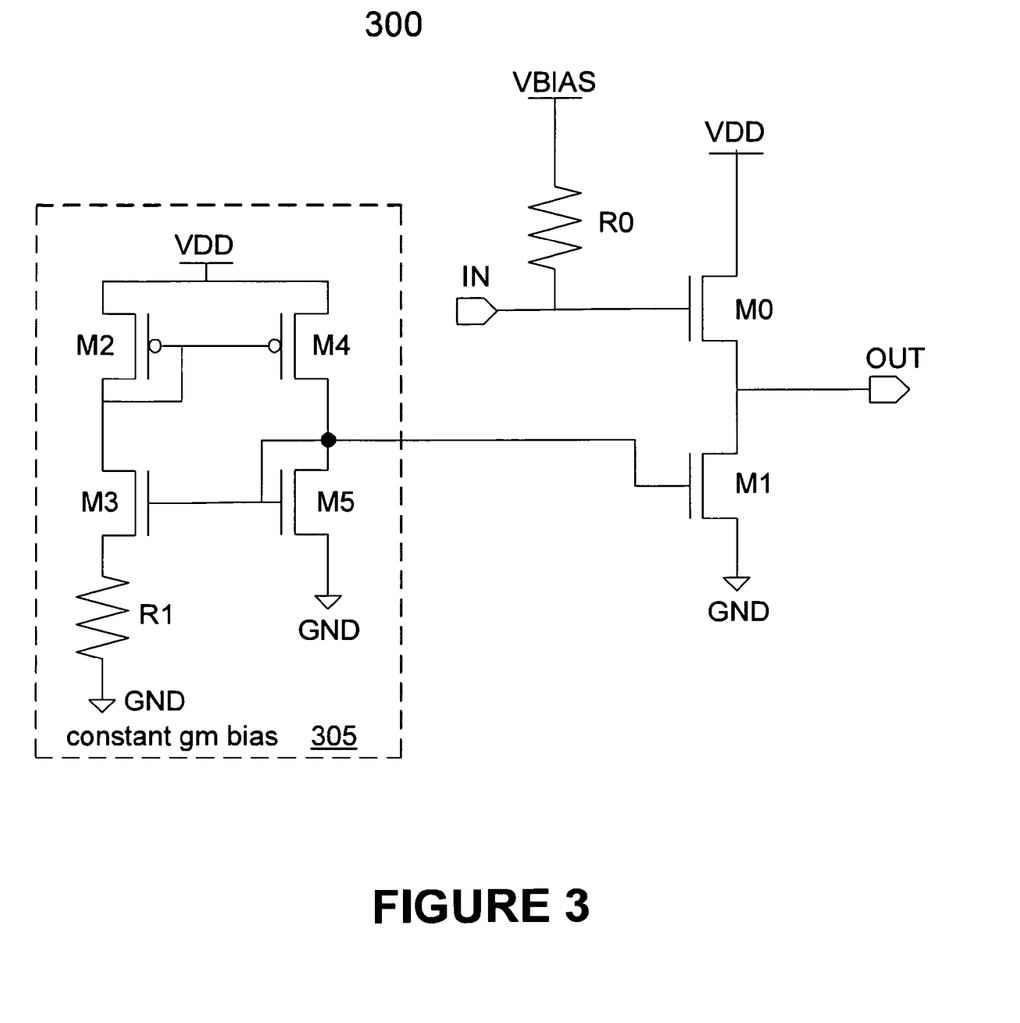
FIG. 3, in accordance with some embodiments of the invention, illustrates an exemplary implementation of a low-loss, impedance-matched source follower for repeating or switching signals on a high speed link, including illustration of an exemplary bias current circuit.

FIG. 3, in accordance with some embodiments of the invention, illustrates an exemplary implementation of a low-loss, impedance-matched source follower for repeating or switching signals on a high speed link, including illustration of an exemplary bias current circuit to provide bias current I. In some embodiments, the bias current circuit may comprise, for example, an external calibration circuit or other circuit providing a degree of isolation from process, source voltage and temperature variations. However, in the embodiment of source follower circuit 300 shown in FIG. 3, the bias current circuit comprises a constant transconductance bias circuit 305 coupled to bias transistor M1.

As illustrated in FIG. 3, bias transistor M1 is an NMOS transistor. However, in other embodiments, bias transistor M1 may be a transistor of a different type or technology. For example, alternative embodiments may use a PMOS transistor as a bias transistor. As illustrated in FIG. 3, bias transistor M1 has gate, source and drain terminals. While it isn't shown, bias transistor M1 may also have a bulk terminal. The gate terminal of bias transistor M1 is coupled (as shown, directly coupled) to constant transconductance bias circuit 305, which controls bias transistor M1. The source terminal of bias transistor M1 is coupled (as shown, directly coupled) to signal ground. The drain terminal of bias transistor M1 is coupled (as shown, directly coupled) to output port OUT and the source terminal of source follower transistor M0.

The interrelationship between the gain A of source follower transistor M0, its transconductance $g_{mM0}$, its drain to source conductance $g_{dsM0}$ nd the drain to source conductance $g_{dsM1}$ of bias transistor M1 is given by the following equation:

$$A = \frac{g_{mM0}}{(g_{mM0} + g_{dsM0} + g_{dsM1})} \quad \text{Equation 1}$$

Gain A may be selected in accordance with desired operating conditions. The conductance and transconductance parameters may then be determined by specific parameters of transistors M0 and M1 in order to achieve an output impedance to match the impedance of the output transmission line coupled to output port OUT. As previously noted, the selection of gain, components and their parameters (e.g. channel width and length) will vary from one embodiment to the next based on acceptable tolerances for given operating conditions, which may be optimized through simulation and testing. As illustrated in FIG. 3, constant transconductance bias circuit 305 comprises a known bidirectional current mirror using an external resistor R1 to isolate it from process, source voltage and temperature variations. In other embodiments, other known constant transconductance bias circuits may be used in place of constant transconductance bias circuit 305. As shown in FIG. 3, the voltage from gate to signal ground for current mirror transistors M3, M5 and bias transistor M1 will be the same. The value of this common voltage will be the gate to source voltage ($V_{GS}$) of current mirror transistor M3 plus the voltage across external resistor R1.

Constant transconductance circuit 305 is formed by NMOS transistors M3, M5, PMOS transistors M2, M4 and external resistor R1. Assuming the width to length ratios of transistors M2, M3 and M4 are the same while the width to length ratio of transistor M5 is N times larger than the ratio for M2, M3 and M4, the following set of equations can be used to determine the transconductance Gm for transistor M5:

$$V_{GS3} I*R1 = V_{GS5}$$  Equation 2

$$V_{GS} = \sqrt{\frac{2 \times I}{u_n \times C_{ox} \times (W/L)}} + V_{thn}$$  Equation 3

Substituting Equation 3 in Equation 2 results in Equation 4:

$$\sqrt{\frac{2 \times I}{u_n \times C_{ox} \times (W/L)_3}} + V_{thn} + I \times R1 = \sqrt{\frac{2 \times I}{u_n \times C_{ox} \times (W/L)_5}} + V_{thn}$$  Eq. 4

Solving Equation 4 for current I results in Equation 5:

$$I = \frac{2}{un \times Cox \times (W/L)_5} \times \frac{1}{R1^2} \times \left(1 - \frac{1}{\sqrt{N}}\right)^2$$  Equation 5

An equation for transconductance (Gm), which is the change in output current divided by the change in gate voltage, is provided in Equation 6:

$$g_m = \sqrt{2 \times u_n \times C_{ox} \times (W/L)_5 \times I}$$  Equation 6

Substituting current I in Equation 5 in Equation 6 and simplifying results in Equation 7:

$$gm = \frac{2}{R1}\left(1 - \frac{1}{\sqrt{N}}\right)$$  Equation 7

Equation 7 shows that the transconductance Gm of transistor M5 is dependent upon the value of R1 and N. N is a constant. If R1 can be made a constant, or as close as possible to it, then the transconductance Gm of transistor M5 can be made constant, or as close as possible to it. This is done by mounting resistor R1 external to the device comprising other circuitry to make R1 insensitive to process, voltage and temperature variations.

By placing resistor R1 external to a device package containing source follower circuit 300, the magnitude of resistance of resistor R1 will not vary due to variations in process, voltage or temperature in the packaged device. In some embodiments resistor R1 will be a variable resistor or fixed resistor set or selected based on the parameters of particular device packages containing source follower circuit 300. As a result of isolating R1, the transconductance of current mirror transistor M5, bias transistor M1 and source follower transistor M0 will be constant. As a result of constant transconductance of bias transistor M1 and source follower transistor M0, the gain and output impedance of source follower transistor M0 will be constant.

Figure 4:
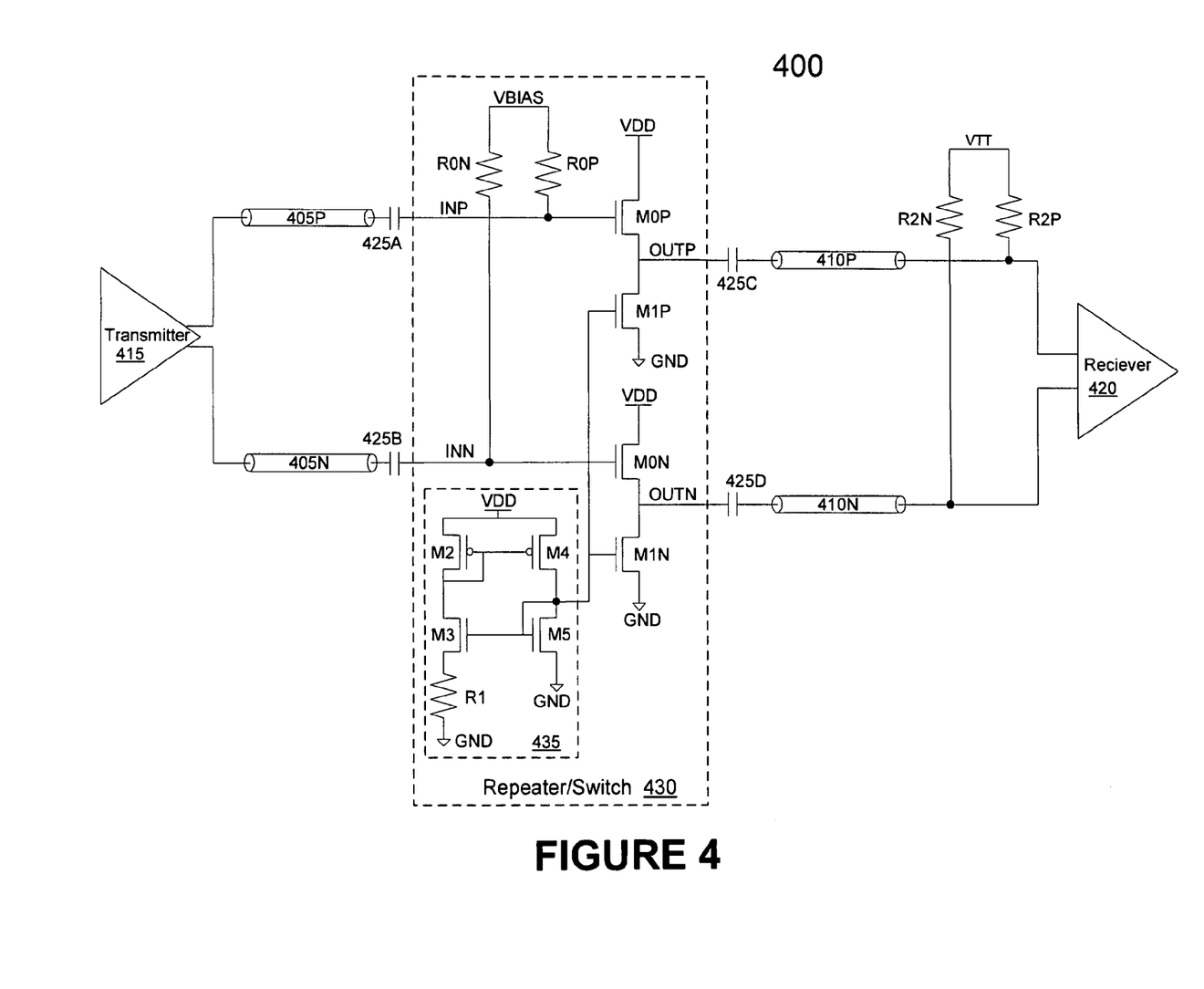
FIG. 4, in accordance with some embodiments of the invention, illustrates an exemplary implementation of a low-loss, impedance-matched source follower for repeating or switching signals in a differential high speed link system.

FIG. 4, in accordance with some embodiments of the invention, illustrates an exemplary implementation of a low-loss, impedance-matched source follower for repeating or switching signals in a differential high speed link system. While in other embodiments the high speed link system may comprise a single-ended high speed link, in this particular embodiment high speed link system 400 comprises a differential high speed link comprising differential input transmission line 405P/N, output transmission line 410P/N, differential transmitter 415, differential receiver 420, AC coupling capacitors 425A-D, termination resistors R2P/N and differential repeater/switch circuit 430.

Differential transmitter 415 is coupled to and transmits complementary (differential) signals on input transmission line 405P/N. Depending on the particular embodiment, AC coupling capacitors 425A, B may be placed anywhere along input transmission line 405P/N, including at its end where input transmission line 405P/N is coupled (as shown, directly) to input ports INP, INN of differential repeater/switch circuit 430. Similarly, depending on the particular embodiment, AC coupling capacitors 425C, D may be placed anywhere along output transmission line 410P/N, including at its beginning where output transmission line 410P/N is coupled (as shown, directly) to output ports OUTP, OUTN of differential repeater/switch circuit 430. Differential receiver 420 is coupled to and receives complementary signals on output transmission line 410P/N. At the end of output transmission line 410P/N near differential receiver 420, output transmission line 410P/N is terminated to termination voltage VTT through termination resistors R2N, R2P, which may form part of a receiver circuit (not shown in its entirety).

The value of termination resistors R2N, R2P may be selected to approximately (i.e. within a tolerance of +/−10%) match the impedance of output transmission line 410P/N. For example, when the impedance of output transmission line 410P/N is 50 Ohms, termination resistors R2N, R2P may each be 50 Ohms. The magnitude of termination voltage VTT may have a magnitude in common with bias voltage VBIAS at, for example, one-half or two-thirds the magnitude of source voltage VDD, where VDD provides power for circuit operation. The magnitude of source voltage VDD as well as component parameters may vary depending on the technology, e.g., 3.3 V, 1.8 V. Other transmission line termination techniques may be used in addition to or in place of biased termination resistors R2N, R2P, including the improved differential type termination technique presented in U.S. patent application Ser. No. 12/210,343 filed Sep. 15, 2008, entitled "REDUCED POWER DIFFERENTIAL TYPE TERMINATION CIRCUIT," which may reduce the direct current necessary to produce termination voltage VTT while maintaining or improving signal integrity and overall performance.

Differential repeater/switch circuit 430 is shown inserted into a high speed link represented by input and output transmission lines 405P/N, 410P/N. High speed links include, but are not limited to, PCI Express, HDMI, DisplayPort and DVI. Differential repeater/switch circuit 430 may, for example, be used to switch signals and/or extend link length. For example, a DisplayPort cable may be several meters in length. That length may be doubled or more than doubled using an embodiment of the present invention to switch and/or repeat signals transmitted onto input transmission line 405P/N by differential transmitter 415. Differential repeater/switch circuit 430 or a single-ended repeater/switch circuit, may also be used to bidirectionally or unidirectionally multiplex and/or demultiplex a plurality of high speed link input and output transmission lines.

As illustrated in FIG. 4, differential repeater/switch circuit 430 comprises differential signal input port INP, INN, differential signal output port OUTP, OUTN, source voltage VDD, termination or bias voltage VBIAS, signal ground GND, source follower transistors M0P, M0N, bias transistors M1P, M1N, termination resistors R0P, R0N and constant transconductance bias circuit 435. As illustrated, differential signal input port INP, INN and differential signal output port OUTP, OUTN are for coupling, respectively, to differential input and output transmission lines 405P/N, 410P/N of the high speed link.

At the end of input transmission line 405P/N near or within differential repeater/switch circuit 430, input transmission line 405P/N is terminated to bias or termination voltage VBIAS through termination resistors R0N, R0P, which may form part of differential repeater/switch circuit 430. The value of termination resistors R0N, R0P may be selected to approximately (i.e. within a tolerance of +/−10%) match the impedance of input transmission line 405P/N. For example, when the impedance of input transmission line 405P/N is 50 Ohms, termination resistors R0N, R0P may each be 50 Ohms. The magnitude of bias voltage VBIAS may have a magnitude in common with termination voltage VTT at, for example, one-half or two-thirds the magnitude of source voltage VDD, where VDD provides power for circuit operation. The magnitude of source voltage VDD as well as component parameters may vary depending on the technology, e.g., 3.3 V, 1.8 V. Other transmission line termination techniques may be used in addition to or in place of biased termination resistors R0N, R0P, including the improved differential type termination technique presented in U.S. patent application Ser. No. 12/210,343 filed Sep. 15, 2008, entitled "REDUCED POWER DIFFERENTIAL TYPE TERMINATION CIRCUIT," which may reduce the direct current necessary to produce bias voltage VBIAS while maintaining or improving signal integrity and overall performance.

Source follower transistor M0P is an NMOS transistor configured as a source follower. However, in other embodiments, source follower transistor M0P may be a transistor of a different type or technology. For example, an alternative embodiment may use a PMOS transistor as a source follower. As illustrated in FIG. 4, source follower transistor M0P has gate, source and drain terminals. While it isn't shown, source follower transistor M0P may also have a bulk terminal. The gate terminal of source follower transistor M0P is coupled (as shown, directly coupled) to input port INP so that an input signal controls source follower transistor M0P. The source terminal of source follower transistor M0P is coupled (as shown, directly coupled) to output port OUTP and the drain terminal of bias transistor M1P providing bias current $I_P$. The drain terminal of source follower transistor M0P is coupled (as shown, directly coupled) to source voltage VDD.

In some embodiments, in order to avoid a body effect (i.e. threshold variation), the bulk and source terminals of source follower transistor M0P may be connected, e.g., by constructing source follower transistor M0P using a deep n-well process to connect the bulk to the source. In some embodiments, the gain of source follower transistor M0P may be set at or close to unity so that the amplitude of the signal it outputs through output port OUTP closely follows the amplitude of the signal it receives through input port INP. In other embodiments, the gain may be fixed or variable in accordance with the needs of a particular implementation.

Source follower transistor M0N is an NMOS transistor configured as a source follower. However, in other embodiments, source follower transistor M0N may be a transistor of a different type or technology. For example, an alternative embodiment may use a PMOS transistor as a source follower. As illustrated in FIG. 4, source follower transistor M0N has gate, source and drain terminals. While it isn't shown, source follower transistor M0N may also have a bulk terminal. The gate terminal of source follower transistor M0N is coupled (as shown, directly coupled) to input port INN so that an input signal controls source follower transistor M0N. The source terminal of source follower transistor M0N is coupled (as shown, directly coupled) to output port OUTN and the drain terminal of bias transistor M1N providing bias current $I_N$. The drain terminal of source follower transistor M0N is coupled (as shown, directly coupled) to source voltage VDD.

In some embodiments, in order to avoid a body effect (i.e. threshold variation), the bulk and source terminals of source follower transistor M0N may be connected, e.g., by constructing source follower transistor M0N using a deep n-well process to connect the bulk to the source. In some embodiments, the gain of source follower transistor M0N may be set at or close to unity so that the amplitude of the signal it outputs through output port OUTN closely follows the amplitude of the signal it receives through input port INN. In other embodiments, the gain may be fixed or variable in accordance with the needs of a particular implementation.

Bias transistors M1P, M1N and constant transconductance bias circuit 435 together form a bias current circuit for source follower transistors M0P, M0N to ensure that they provide essentially constant gain and output impedance despite process, voltage and temperature variations of differential repeater/switch circuit 430, thereby permitting differential repeater/switch circuit 430 to provide improved performance on high speed links. In some embodiments, the bias current circuit may comprise, for example, an external calibration circuit or other circuit providing a degree of isolation from process, source voltage and temperature variations. However, in the embodiment of differential repeater/switch circuit 430 shown in FIG. 4, the bias current circuit comprises a constant transconductance bias circuit 335 coupled to the gate terminals of bias transistors M1P and M1N.

As illustrated in FIG. 4, bias transistors M1P and M1N are NMOS transistors. However, in other embodiments, bias transistors M1P and M1N may be transistors of a different type or technology. For example, alternative embodiments may use a PMOS transistor as a bias transistor. As illustrated in FIG. 4, bias transistors M1P and M1N have gate, source and drain terminals. While not shown, bias transistors M1P and M1N may also have bulk terminals.

The gate terminal of bias transistor M1P is coupled (as shown, directly coupled) to constant transconductance bias circuit 435, which controls bias transistor M1P. The source terminal of bias transistor M1P is coupled (as shown, directly coupled) to signal ground. The drain terminal of bias transistor M1P is coupled (as shown, directly coupled) to output port OUTP and the source terminal of source follower transistor M0P.

Similarly, the gate terminal of bias transistor M1N is coupled (as shown, directly coupled) to constant transconductance bias circuit 435, which controls bias transistor M1N. The source terminal of bias transistor M1N is coupled (as shown, directly coupled) to signal ground. The drain terminal of bias transistor M1N is coupled (as shown, directly coupled) to output port OUTN and the source terminal of source follower transistor M0N.

Constant transconductance bias circuit 435 is coupled to the gate terminals of bias transistors M1P and M1N to provide them and source follower transistors M0P and M0N with constant transconductance, gain and output impedance. As a result, high speed signals transmitted by transmitter 415 onto transmission line 405P/N will be repeated and/or switched onto transmission line 410P/N by repeater/switch circuit 430 with improved performance over switches/repeaters relying on transmission gates. While constant transconductance bias circuit 435 is the same as constant transconductance bias circuit 305 illustrated in FIG. 3, as previously discussed, in other embodiments other circuits achieving the same objectives may be used in place of differential repeater/switch circuit 430 or single-ended repeater/switch circuit.

Embodiments of the present invention may be utilized in a wide variety of high speed data transmission applications involving repeating and/or switching high speed signals on high speed links such as PCI Express, HDMI, DisplayPort and DVI. Embodiments of the present invention may, for example, be used to extend link length by repeating high speed signals and/or to switch signals such as by bidirectionally or unidirectionally multiplexing and/or demultiplexing a plurality of high speed link input and output transmission lines.

The inventions described herein provide numerous benefits. While in some implementations it may consume more power than some well known repeaters and switches using transmission gates, switching or repeating signals on a high speed link using an impedance matched source follower, at least in some implementations, may improve signal integrity through reduced attenuation and other degradation of high speed signals, including those implementing transmit pre-emphasis to compensate for transmission losses or distortions, and by avoiding impedance discontinuities over process, voltage and temperature variations. Avoiding mismatched impedance is an improvement in addition to avoiding the RC time constant problem with transmission gates used in high speed links. Embodiments of the invention may also improve repeater/switch performance and utility by passing signals with higher frequencies, including those with transmit pre-emphasis, and by driving a broader range of loads, e.g., heavily capacitive loads. It may also be implemented at less cost and die area relative to other competing solutions.

While the present invention has been described with respect to a limited number of embodiments, those skilled in the art will appreciate numerous modifications and variations there from. It is intended that the appended claims cover all such modifications and variations as fall within the true spirit and scope of this present invention.

What is claimed:

1. A circuit for switching or repeating signals on a high speed link comprising:
    an input and an output for coupling, respectively, to input and output transmission lines for the high speed link;
    a termination resistor coupling the input to a termination voltage;
    a first transistor, having first gate, source and drain terminals, configured as a source follower wherein the first gate terminal is coupled to the input, the first source terminal is coupled to the output and the first drain terminal is coupled to a voltage source; and
    a bias current circuit coupled to the first source terminal and output for providing bias current for the first transistor resulting in essentially constant output impedance over process, voltage and temperature variations.

2. The circuit of claim 1, wherein the bias current circuit comprises:
    a constant transconductance bias circuit; and
    a second transistor, having second gate, source and drain terminals, wherein the second drain terminal is coupled to the first source terminal and the output, the second source terminal is coupled to ground and the second gate terminal is coupled to the constant transconductance bias circuit.

3. The circuit of claim 1, wherein the bias current circuit comprises an external calibration circuit.

4. The circuit of claim 1, wherein the termination voltage is one-half or two-thirds of the voltage source.

5. The circuit of claim 1, wherein the termination resistor approximately matches an impedance of the input transmission line.

6. The circuit of claim 1, the first transistor further comprising a first bulk terminal, wherein the first bulk terminal is coupled to the first source terminal.

7. The circuit of claim 1, wherein the high speed link comprises one of Peripheral Component Interconnect (PCI) Express, High Definition Multimedia Interface (HDMI), DisplayPort and Digital Visual Interface (DVI).

8. The circuit of claim 1, wherein the high speed link implements transmit pre-emphasis to compensate for transmission losses or distortions.

9. A circuit for switching or repeating signals on a differential signal high speed link comprising:
    a differential input comprising positive input and negative input for coupling to differential input transmission lines for the high speed link;
    a differential output comprising positive output and negative output for coupling to differential output transmission lines for the high speed link;
    a first termination resistor coupling the positive input to a termination voltage;
    a second termination resistor coupling the negative input to the termination voltage;
    a first transistor, having first gate, source and drain terminals, configured as a source follower wherein the first gate terminal is coupled to the positive input, the first source terminal is coupled to the positive output and the first drain terminal is coupled to a voltage source;
    a second transistor, having second gate, source and drain terminals, configured as a source follower wherein the second gate terminal is coupled to the negative input, the second source terminal is coupled to the negative output and the second drain terminal is coupled to the voltage source; and
    a bias current circuit coupled to the first and second source terminals and the positive and negative outputs for providing bias currents for the first and second transistors resulting in essentially constant output impedance over process, voltage and temperature variations.

10. The circuit of claim 9, wherein the bias current circuit comprises:
    a constant transconductance bias circuit;
    a third transistor, having third gate, source and drain terminals, wherein the third drain terminal is coupled to the first source terminal and the positive output, the third source terminal is coupled to ground and the third gate terminal is coupled to the constant transconductance bias circuit; and a fourth transistor, having fourth gate, source and drain terminals, wherein the fourth drain terminal is coupled to the second source terminal and the negative output, the fourth source terminal is coupled to ground and the fourth gate terminal is coupled to the constant transconductance bias circuit.

11. The circuit of claim 9, wherein the bias current circuit comprises an external calibration circuit.

12. The circuit of claim 9, wherein the termination voltage is one-half or two-thirds of the voltage source.

13. The circuit of claim 9, wherein each of the first termination resistor approximately matches an impedance of the positive input transmission line and the second termination resistor approximately matches an impedance of the negative input transmission line.

14. The circuit of claim 9, the first transistor further comprising a first bulk terminal and the second transistor further comprising a second bulk transistor, wherein the first bulk terminal is coupled to the first source terminal and the second bulk terminal is coupled to the second source terminal.

15. The circuit of claim 9, wherein the high speed link comprises one of Peripheral Component Interconnect (PCI) Express, High Definition Multimedia Interface (HDMI), DisplayPort and Digital Visual Interface (DVI).

16. The circuit of claim 9, wherein the high speed link implements transmit pre-emphasis to compensate for transmission losses or distortions.

17. A system for switching or repeating signals on a high speed link comprising:

a high speed link comprising input and output transmission lines;

a transmitter coupled to the input transmission line;

a receiver coupled to the output transmission line; and a circuit coupled between the input and output transmission lines for switching or repeating signals transmitted onto the input transmission line by the transmitter, the circuit comprising:

an input and an output for coupling, respectively, to the input and output transmission lines;

a termination resistor coupling the input to a termination voltage;

a first transistor, having first gate, source and drain terminals, configured as a source follower wherein the first gate terminal is coupled to the input, the first source terminal is coupled to the output and the first drain terminal is coupled to a voltage source; and a bias current circuit coupled to the first source terminal and output for providing bias current for the first transistor resulting in essentially constant output impedance over process, voltage and temperature variations.

18. The circuit of claim 17, wherein the bias current circuit comprises:

a constant transconductance bias circuit; and a second transistor, having second gate, source and drain terminals, wherein the second drain terminal is coupled to the first source terminal and the output, the second source terminal is coupled to ground and the second gate terminal is coupled to the constant transconductance bias circuit.

19. The circuit of claim 17, wherein the high speed link comprises a differential high speed link.

20. The circuit of claim 17, wherein the high speed link comprises one of Peripheral Component Interconnect (PCI) Express, High Definition Multimedia Interface (HDMI), DisplayPort and Digital Visual Interface (DVI).

* * * * *